(12) United States Patent
Yu et al.

(10) Patent No.: US 9,082,765 B2
(45) Date of Patent: Jul. 14, 2015

(54) BUMP-ON-TRACE (BOT) STRUCTURES AND METHODS FOR FORMING THE SAME

(71) Applicant: Taiwan Semiconductor Manufacturing Company, Ltd., Hsin-Chu (TW)

(72) Inventors: Chen-Hua Yu, Hsin-Chu (TW); Chien-Hsun Lee, Chu-Tung Town (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 60 days.

(21) Appl. No.: 13/789,852

(22) Filed: Mar. 8, 2013

(65) Prior Publication Data

US 2014/0252596 A1 Sep. 11, 2014

(51) Int. Cl.
*H01L 23/00* (2006.01)
*H01L 21/00* (2006.01)
*H01L 23/498* (2006.01)
*H01L 21/768* (2006.01)
*H01L 21/48* (2006.01)
*H01L 21/56* (2006.01)
*H01L 23/14* (2006.01)

(52) U.S. Cl.
CPC ...... *H01L 23/49811* (2013.01); *H01L 21/4857* (2013.01); *H01L 21/563* (2013.01); *H01L 21/76885* (2013.01); *H01L 23/49822* (2013.01); *H01L 23/49894* (2013.01); *H01L 23/147* (2013.01); *H01L 2224/13* (2013.01); *H01L 2224/16225* (2013.01); *H01L 2224/73204* (2013.01); *H01L 2924/15311* (2013.01)

(58) Field of Classification Search
CPC ....... H01L 23/488; H01L 23/48; H01L 24/16; H01L 24/13; H01L 2224/81; H01L 23/4981; H01L 24/81; H01L 25/0657; H01L 24/05; H01L 24/14; H01L 2924/01006; H01L 23/49816; H01L 23/49811; H01L 21/76885; H01L 2924/152311; H01L 2224/16; H01L 2224/13
See application file for complete search history.

(56) References Cited

U.S. PATENT DOCUMENTS

| | | | |
|---|---|---|---|
| 6,147,413 A * | 11/2000 | Farnworth | 257/779 |
| 6,731,014 B2 | 5/2004 | Sota | |
| 7,595,557 B2 * | 9/2009 | Watase et al. | 257/773 |
| 8,426,321 B1 * | 4/2013 | Dirk et al. | 438/780 |
| 2001/0007883 A1 * | 7/2001 | Willett et al. | 524/47 |
| 2004/0113260 A1 * | 6/2004 | Sunohara et al. | 257/698 |
| 2005/0191836 A1 * | 9/2005 | Tzeng et al. | 438/612 |
| 2006/0286689 A1 * | 12/2006 | Watase et al. | 438/5 |
| 2013/0228919 A1 * | 9/2013 | Choi et al. | 257/737 |

* cited by examiner

Primary Examiner — Alonzo Chambliss
(74) Attorney, Agent, or Firm — Slater & Matsil, L.L.P.

(57) ABSTRACT

An integrated circuit structure includes a package component, which includes a dielectric layer and a metal trace over and in contact with the dielectric layer. The dielectric layer includes a first dielectric material and a second dielectric material in the first dielectric material. The first dielectric material is a flowable and curable material. The second dielectric material comprises a functional group selected from the group consisting essentially of (—C—N—), (—C—O—), (—N—C=O), and combinations thereof.

20 Claims, 4 Drawing Sheets

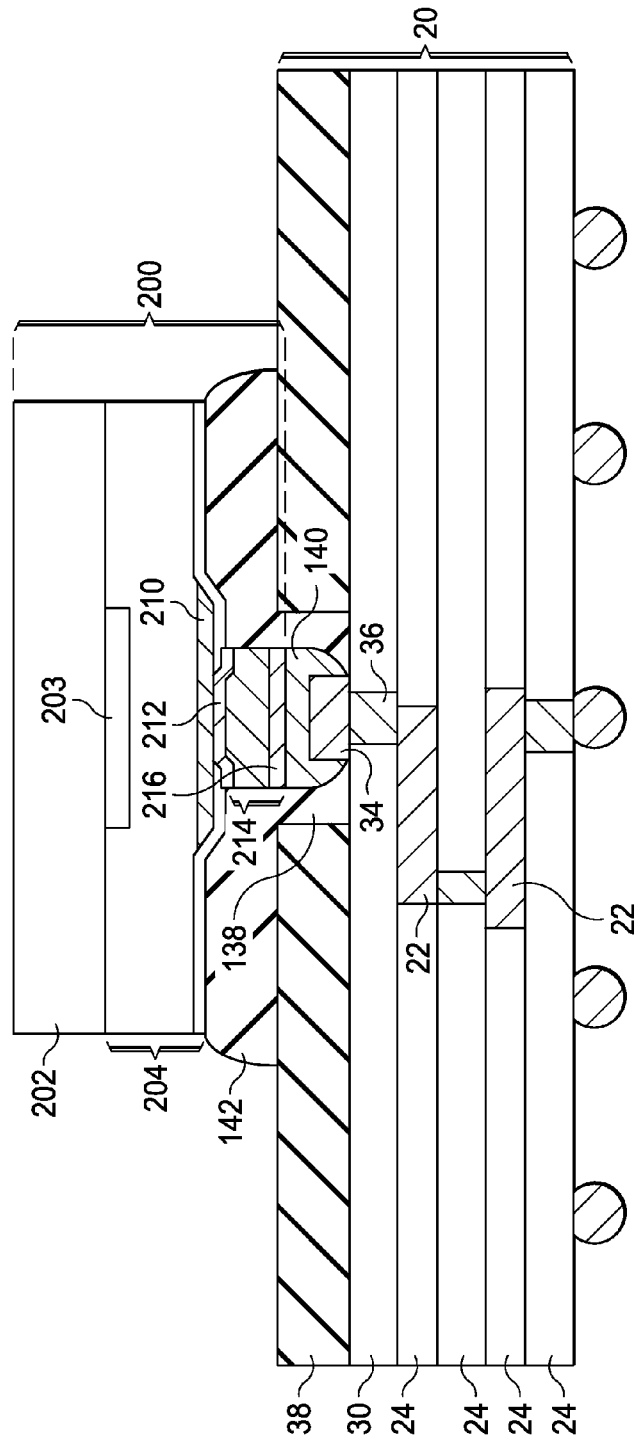
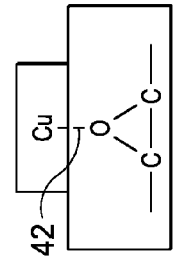
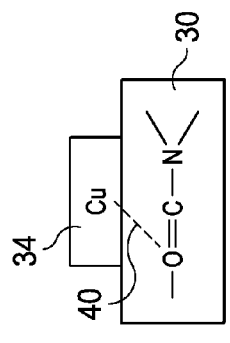
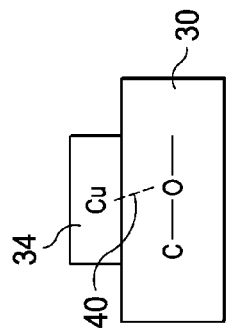
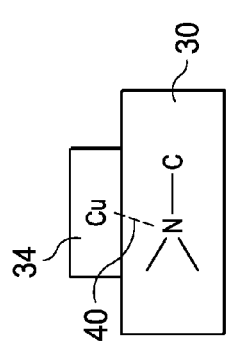

BUMP-ON-TRACE (BOT) STRUCTURES AND METHODS FOR FORMING THE SAME

BACKGROUND

Bump-on-Trace (BOT) structures were used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is low. The conventional BOT structures may achieve the same reliability as the conventional bond structures that are based on metal pads.

With the increasing down-scaling of integrated circuits, the metal traces become increasingly narrower. The metal traces in a die are formed over a dielectric layer, and are adhered to the underlying dielectric layer mainly by anchoring forces, which are generated mainly due to the surface roughness of the dielectric layer. Narrow metal traces have small contact areas with the underlying dielectric layer, and hence the anchoring forces are small. Hence, the delamination between the metal traces and the dielectric layer becomes a severe problem.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1, 2, 3, 4A, 4B, 5A, and 5B are cross-sectional views and top views of intermediate stages in the manufacturing of a Bump-on-Trace (BOT) structure in accordance with some exemplary embodiments;

FIGS. 6A, 6B, and 6C schematically illustrate the Van Der Waals force generated between the atoms of a dielectric layer and the overlying metal trace in accordance with some exemplary embodiments; and FIG. 6D schematically illustrates the Van Der Waals force generated between the atoms of a dielectric layer and the overlying metal trace in a conventional BOT structure.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Bump-on-Trace (BOT) structure and the methods of forming the same are provided in accordance with various exemplary embodiments. The intermediate stages of forming the BOT structure are illustrated. The variations of the embodiments are discussed. Throughout the various views and illustrative embodiments, like reference numbers are used to designate like elements.

Figures 1, 2, 3:
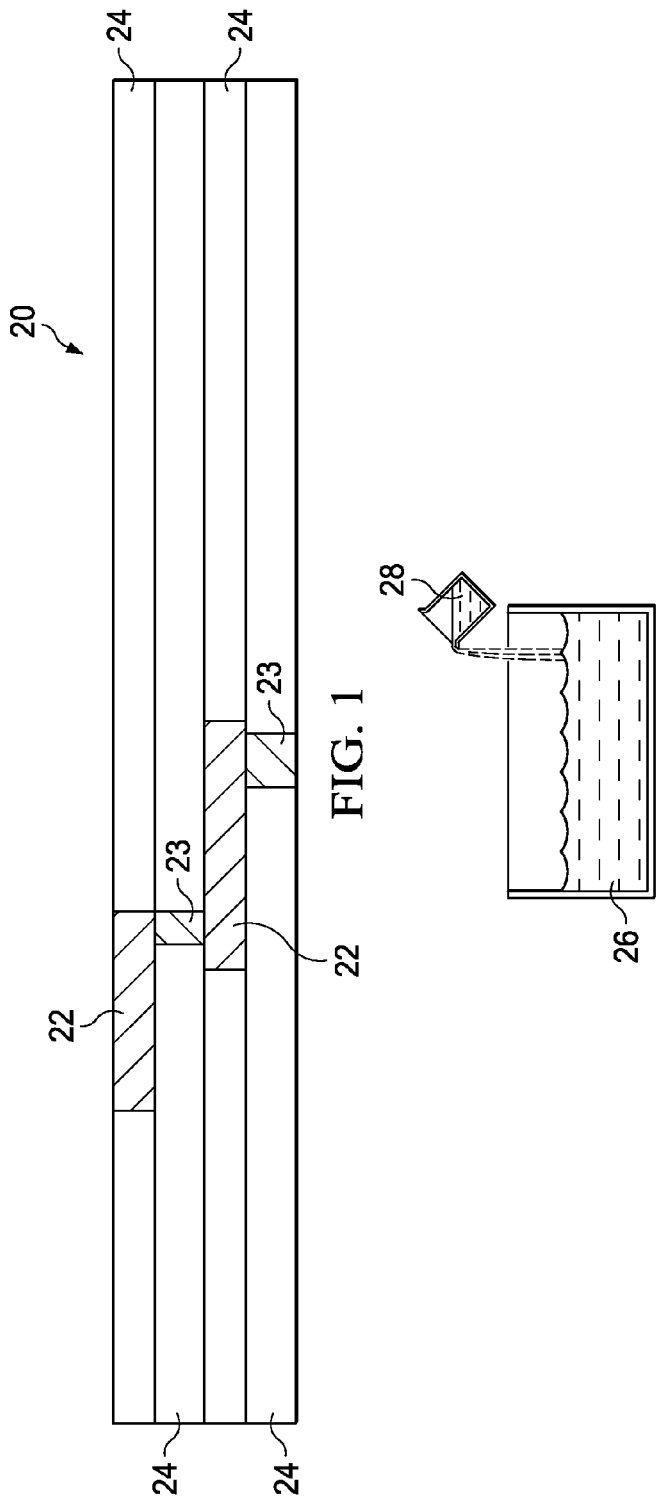

FIG. 1 illustrates a cross-sectional view of package component 20. Package component 20 may be a package substrate, although it may be another type of package component such as an interposer, a device die, or the like. Package component 200 includes metal lines 22 and vias 23 formed in dielectric layers 24, which may be laminate films, silicon oxide layers, silicon nitride layers, or the like, for example. Alternatively, metal lines 22 and vias 23 may be formed over a semiconductor substrate (such as a silicon substrate, not shown) or a dielectric core (not shown), and in the dielectric layers that are formed over the semiconductor substrate or the dielectric core. In the embodiments wherein package component 20 is a device die, package component 20 may include a semiconductor substrate (not show), and integrated circuit devices (such as transistors, not shown) formed at a top surface of the semiconductor substrate.

FIG. 2 illustrates the preparation of a dielectric coating material. In some embodiments, the dielectric coating material includes a first dielectric material 26, which may be a flowable material such as a liquid or a gel. Dielectric material 26 may be a polymer, and may be an epoxy in some exemplary embodiments.

A second dielectric material 28 is mixed with dielectric material 26. Dielectric material 28 may comprise the functional groups of (—C—N—), (—C—O—), and/or (—N—C=O). In some embodiments, the dielectric material 28 that comprises the (—C—N—) functional group may be a polymer that has amine as the repeating unit. In alternative embodiments, the dielectric material 28 that comprises the (—C—O—) functional group may be a polymer having ester as the repeating unit. Furthermore, the dielectric material 28 that comprises the (—C—O—) functional group does not include functional groups comprising two carbon (C) atoms and one oxygen atom circularly bonded. In yet alternative embodiments, the dielectric material 28 that comprises the (—N—C=O) functional group may be a polymer having amide as the repeating unit.

The mixing of dielectric material 26 with dielectric material 28 may be performed at a temperature between about 50° C. and about 130° C. Dielectric material 28 may have a weight percentage between about 10 percent and about 70 percent in the resulting mixture, which is referred to dielectric coating material 30 (FIG. 3) hereinafter. The mixture is fully stirred, so that dielectric material 28 is uniformly distributed in dielectric coating material 30. Dielectric coating material 30 is a flowable material in accordance with some embodiments, although it may have another appearance.

Next, as shown in FIG. 3, dielectric coating material 30 is coated onto dielectric layer 24 and metal lines 22. In some embodiments, the thickness of dielectric coating material 30 is between about 2 μm and about 30 μm. It is appreciated, however, that the values recited throughout the description are merely examples, and may be changed to different values. After being coated, dielectric coating material 30 is cured and solidified. A patterning is then performed to form opening 32 in dielectric coating material 30, wherein metal line 22 is exposed through opening 32.

Figure 4A:
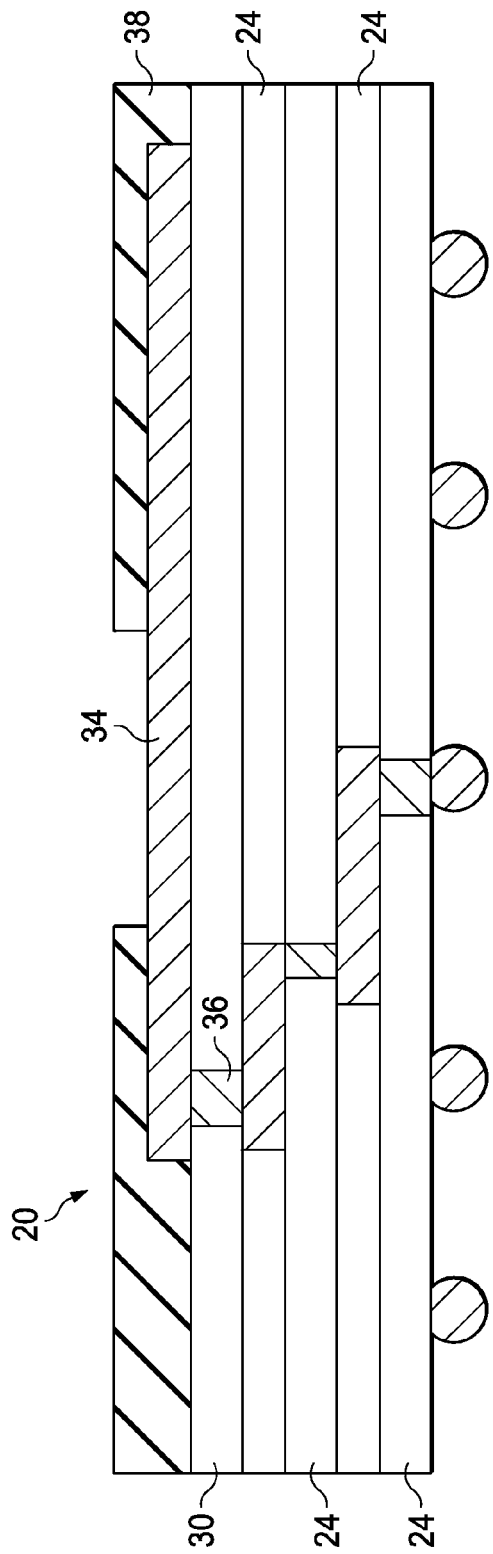

Metal trace 34 is then formed on dielectric coating material 30, as shown in FIG. 4A. Metal trace 34 may be formed of substantially pure copper, aluminum copper, or other metallic materials such as tungsten, nickel, palladium, gold, and/or alloys thereof. Via 36 is formed in opening 32 (FIG. 3), and electrically connects metal trace 34 to the underlying metal line 22. The bottom surface of metal trace 34 is in physical contact with the top surface of dielectric coating material 30. In some embodiments, protection layer 38, which may be a solder mask, is formed to cover some portions of metal trace 34, while leaving a portion of metal trace 34 uncovered. Protection layer 38 is dielectric material. Protection layer 38 contacts the top surfaces and the sidewalls of metal trace 34, and the top surface of dielectric coating material 30. In alternative embodiments, protection layer 38 is not formed, and metal trace 34 is not covered before bonding. The subsequently formed BOT bond is formed on metal trace 34 that has not protection layer formed thereon.

Figure 4B:
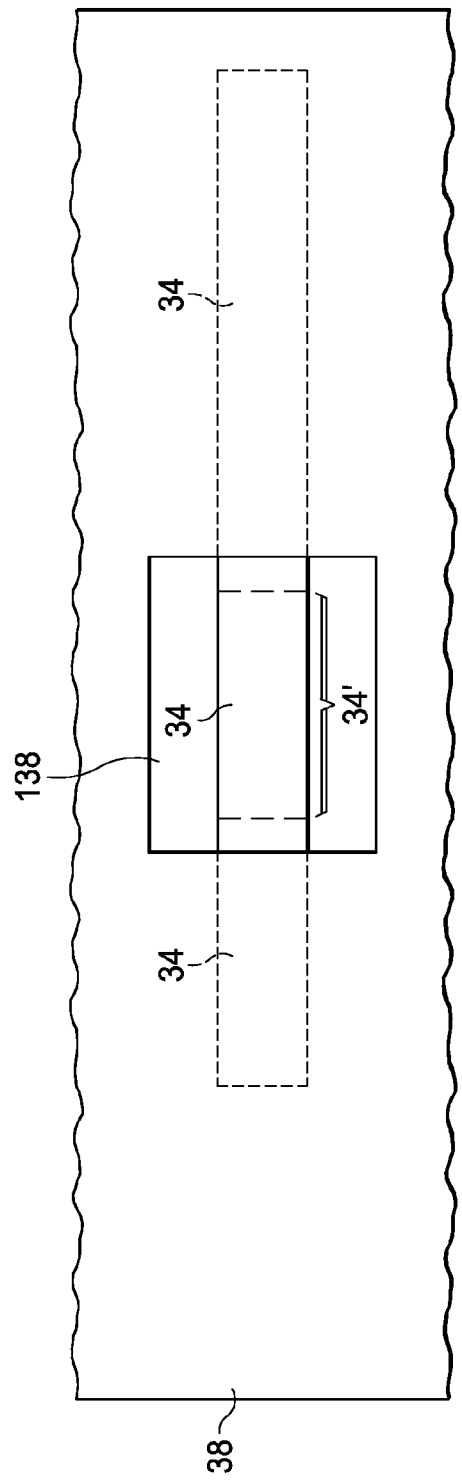

FIG. 4B illustrates a top view of metal trace 34, wherein portion 34' is where the BOT bond is to be formed. The portions of metal trace 34 on the opposite sides of portion 34' may have substantially the same width as portion 34'. In the embodiments wherein protection layer 38 is formed, protection layer 38 has opening 138, through which portion 34' of metal trace 34 is exposed.

Figure 5A:
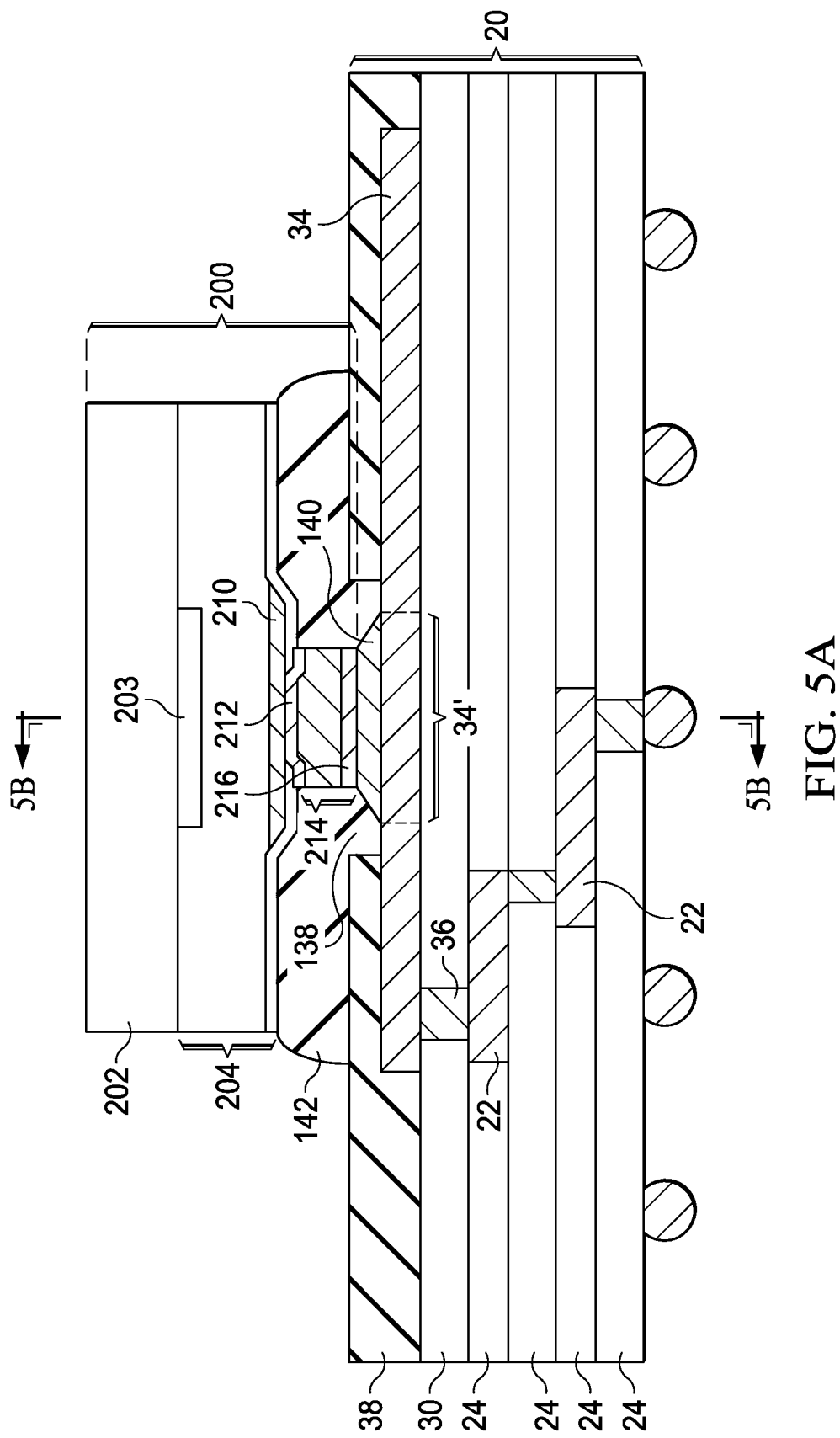

FIGS. 5A and 5B illustrate the bonding of package component 200 to package component 20 through a BOT bonding scheme. In accordance with some embodiments, package component 200 is a device die that includes active devices 203 (such as transistors) therein. Alternatively, package component 200 is a passive component (such as an interposer) that does not have active devices therein. In the embodiments wherein package component 200 is a device die, substrate 202 may be a semiconductor substrate such as a silicon substrate, although it may include other semiconductor materials. Interconnect structure 204, which includes metal lines and vias (not shown) formed therein and connected to active devices 203, is formed on substrate 202. Interconnect structure 204 may include an Inter-Layer Dielectric (ILD, not shown) and Inter-Metal Dielectrics (IMDs, not shown). The IMDs may comprise low-k dielectric materials, and may have dielectric constants (k values) lower than about 3.0. The low-k dielectric materials may also be extreme low-k dielectric materials having k values lower than about 2.5, for example.

Package component 200 may further include metal pad 210, Under-Bump Metallurgy (UBM) 212 on metal pad 210, and metal pillar 214 on UBM 212. Metal pillar 214 may comprise a copper pillar, and hence is alternatively referred to as copper pillar 214, copper-containing bump 214, or metal bump 214. Metal pillar 214 may further comprise a nickel layer, a palladium layer, a gold layer, alloys thereof, or multi-layers thereof, which layer(s) are illustrated as 216.

As also shown in FIG. 5A, package components 20 and 200 are bonded to each other through solder region 140 (alternatively referred to as a solder bump). Solder bump 140 may be formed of a lead-free solder, a eutectic solder, or the like. Solder bump 140 is bonded to, and contacts, the top surface and sidewalls of metal trace 34, wherein the top surface faces package component 200. After the bonding of package components 20 and 200, underfill 142 may be filled into the space between package components 20 and 200. Accordingly, underfill 142 may be in contact with metal trace 34 and dielectric coating material 30 (as shown in FIG. 5B). Alternatively, no underfill is dispensed, while the air fills the space between package components 20 and 200.

FIG. 5B illustrates a cross-sectional view of the package structure shown in FIG. 5A, wherein the cross-sectional view is obtained from the plane crossing line 5B-5B in FIG. 5A. As shown in FIG. 5B, solder bump 140 is in contact with the opposite sidewalls of metal trace 34, and may contact the top surface of dielectric coating 30 in some embodiments. Throughout the description, the bond structure comprising copper pillar 214, solder bump 140, and metal trace 34 is referred to as a BOT structure.

FIGS. 6A, 6B, and 6C schematically illustrate the bonds formed between metal trace 34 and dielectric coating material 30. In the illustrated examples, it is assumed that metal trace 34 comprises copper, although other metals may be used. Referring to FIG. 6A, dielectric coating material 30 comprises the (—C—N—) functional group. The nitrogen (N) atoms in the (—C—N—) functional groups cause the copper (Cu) atoms in metal trace 34 to generate induced dipoles due to the properties of the (—C—N—) functional groups. Hence, a strong Van Der Waals force (symbolized by dashed line 40) is generated between a nitrogen atom and a copper atom.

Referring to FIG. 6B, dielectric coating material 30 comprises the (—C—O—) functional group. The oxygen (O) atoms in the (—C—O—) functional groups cause the copper (Cu) atoms in metal trace 34 to generate induced dipoles due to the properties of the (—C—O—) functional groups. Hence, a strong Van Der Waals force 40 is generated between an oxygen atom and a copper atom.

Referring to FIG. 6C, dielectric coating material 30 comprises the (—N—C=O) functional group. The oxygen (O) atoms in the (—N—C=O) functional groups cause the copper (Cu) atoms in metal trace 34 to generate induced dipoles due to the properties of the (—N—C=O) functional groups. Hence, a strong Van Der Waals force 40 is generated between an oxygen atom and a copper atom.

The strong Van Der Waals force 40 in FIG. 6A, 6B, or 6C is added to the respective anchoring force between metal trace 34 and dielectric coating material 30, and the adhesion between metal trace 34 and dielectric coating material 30 is improved. In alternative embodiments in which other metals other than copper are used in metal trace 34, similar strong Van Der Waals force 40 may also be generated, and the adhesion between metal trace 34 and dielectric coating material 30 may also be improved.

FIG. 6D schematically illustrates the bonds formed between copper and a conventionally used dielectric coating material, which has a functional group comprising two carbon atoms and one oxygen atom circularly bonded. In this example, the oxygen atom has it electrons attracted to the sides of the two carbon atoms, and induces a weak induced dipole for the Cu atom. The respective Van Der Waals force 42 is thus weak, which is weaker than the Van Der Waals force 40 in FIG. 6B.

Comparing the Van Der Waals force 40 in FIGS. 6A, 6B, and 6C with the Van Der Waals force 42 in FIG. 6D, it is found that by adding the (—C—N—), (—C—O—), and/or (—N—C=O) functional groups, the Van Der Waals force between the dielectric coating material and the overlying metal trace is increased. Experiment results indicated that by adding the polymer comprising the (—C—N—), (—C—O—), and/or (—N—C=O) functional groups, the adhering strength is increased by about 75 percent. As a result, the adhering force between the bond trace and the dielectric coating material is increased, and the likelihood of have trace peeling is reduced.

In accordance with some embodiments, an integrated circuit structure includes a package component, which includes a dielectric layer and a metal trace over and in contact with the dielectric layer. The dielectric layer includes a first dielectric material and a second dielectric material in the first dielectric material. The first dielectric material is a flowable and curable material. The second dielectric material comprises a functional group selected from the group consisting essentially of (—C—N—), (—C—O—), (—N—C=O), and combinations thereof.

In accordance with other embodiments, an integrated circuit structure includes a first package component, which includes a dielectric layer. The dielectric layer includes an epoxy and a polymer mixed in the epoxy. The polymer includes a functional group selected from the group consisting essentially of (—C—N—), (—C—O—), (—N—C=O), and combinations thereof. A metal trace is overlying and in contact with the dielectric layer. The integrated circuit structure further includes second package component having a metal pillar. A solder region bonds the metal pillar to the metal trace, wherein the solder region contacts a top surface and opposite sidewalls of the metal trace.

In accordance with yet other embodiments, a method of forming a package includes forming a dielectric coating material by mixing a polymer into an epoxy. The polymer includes a functional group selected from the group consisting essentially of (—C—N—), (—C—O—), (—N—C=O), and combinations thereof. The dielectric coating material is coated over a dielectric layer. An opening is formed in the dielectric coating material. A metal trace is formed over and contacting the dielectric coating material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
    a first package component comprising:
        a dielectric layer comprising a first dielectric material and a second dielectric material in the first dielectric material, wherein the first dielectric material is a flowable and curable material, and wherein the second dielectric material comprises a functional group selected from the group consisting essentially of (—C—N—), (—C—O—), (—N—C=O), and combinations thereof; and
        a metal trace over and in contact with the dielectric layer.

2. The integrated circuit structure of claim 1, wherein the functional group is (—C—N—).

3. The integrated circuit structure of claim 2, wherein the second dielectric material comprising the (—C—N—) functional group comprises a polymer with amine as a repeating unit.

4. The integrated circuit structure of claim 1, wherein the functional group is (—C—O—).

5. The integrated circuit structure of claim 4, wherein the second dielectric material that comprises the (—C—O—) functional group comprises a polymer with ester as a repeating unit.

6. The integrated circuit structure of claim 5, wherein the second dielectric material that comprises the (—C—O—) functional group is free from a functional group that comprises two carbon (C) atoms and one oxygen atom circularly bonded.

7. The integrated circuit structure of claim 1, wherein the functional group is (—N—C=O).

8. The integrated circuit structure of claim 7, wherein the second dielectric material that comprises the (—N—C=O) functional group comprises a polymer with amide as a repeating unit.

9. The integrated circuit structure of claim 1, wherein the first dielectric material comprises an epoxy.

10. The integrated circuit structure of claim 1 further comprising:
    a second package component comprising a metal pillar; and
    a solder region bonding the metal pillar to the metal trace, wherein the solder region contacts a top surface and opposite sidewalls of the metal trace.

11. An integrated circuit structure comprising:
    a first package component comprising:
        a dielectric layer comprising:
            an epoxy; and
            a polymer mixed in the epoxy, wherein the polymer comprises a functional group selected from the group consisting essentially of (—C—N—), (—C—O—), (—N—C=O), and combinations thereof; and
        a metal trace over and in contact with the dielectric layer;
    a second package component comprising a metal pillar; and
    a solder region bonding the metal pillar to the metal trace, wherein the solder region contacts a top surface and opposite sidewalls of the metal trace.

12. The integrated circuit structure of claim 11, wherein the polymer that comprises the (—C—N—) functional group comprises amine as a repeating unit.

13. The integrated circuit structure of claim 11, wherein the polymer that comprises the (—C—O—) functional group comprises ester as a repeating unit.

14. The integrated circuit structure of claim 11, wherein the polymer that comprises the (—N—C=O) functional group comprises amide as a repeating unit.

15. The integrated circuit structure of claim 11 further comprising a protection layer covering portions of the metal trace on opposite sides of the solder region, with a portion of the metal trace bonded to the solder region exposed through an opening in the protection layer.

16. A method comprising:
    forming a dielectric coating material by mixing a polymer into an epoxy, wherein the polymer comprises a functional group selected from the group consisting essentially of (—C—N—), (—C—O—), (—N—C=O), and combinations thereof;
    coating the dielectric coating material over a dielectric layer;
    forming an opening in the dielectric coating material; and
    forming a metal trace over and contacting the dielectric coating material.

17. The method of claim 16 further comprising bonding a metal pillar of a package component to the metal trace through a solder region, wherein the solder region is in contact with a top surface and opposite sidewalls of the metal trace.

18. The method of claim 16, wherein the polymer comprises the (—C—N—) functional group, and comprises amine as a repeating unit.

19. The method of claim 16, wherein the polymer comprises the (—C—O—) functional group, and comprises ester as a repeating unit.

20. The method of claim 16, wherein the polymer comprises the (—N—C=O) functional group, and comprises amide as a repeating unit.

* * * * *